United States Patent
Kabelly et al.

(10) Patent No.: US 7,265,598 B2
(45) Date of Patent: Sep. 4, 2007

(54) NARROW ULTRA WIDEBAND PULSE GENERATOR

(75) Inventors: Moti Kabelly, Hod Hasharon (IL); Yossi Keren, Caesaria (IL)

(73) Assignee: Camero-Tech Ltd., Netanya (IL)

( * ) Notice: Subject to any disclaimer, the term of this patent is extended or adjusted under 35 U.S.C. 154(b) by 0 days.

(21) Appl. No.: 11/167,599

(22) Filed: Jun. 28, 2005

(65) Prior Publication Data

US 2006/0267652 A1 Nov. 30, 2006

Related U.S. Application Data

(60) Provisional application No. 60/684,206, filed on May 25, 2005.

(51) Int. Cl.
*H03K 3/64* (2006.01)
*G01S 13/10* (2006.01)

(52) U.S. Cl. .......................... 327/189; 342/85

(58) Field of Classification Search ........ 327/172–175, 327/119, 165, 164, 189; 342/82–85
See application file for complete search history.

(56) References Cited

U.S. PATENT DOCUMENTS

| | | | | |
|---|---|---|---|---|
| 3,374,416 A | * | 3/1968 | Hall et al. | .................. 363/158 |
| 3,764,830 A | * | 10/1973 | Blore et al. | .................. 327/291 |
| 3,832,568 A | * | 8/1974 | Wang | .......................... 307/106 |
| 4,048,567 A | * | 9/1977 | Johnson et al. | .......... 455/226.1 |
| 4,360,867 A | * | 11/1982 | Gonda | ........................ 363/158 |
| 4,727,340 A | * | 2/1988 | Agoston et al. | ............... 331/50 |
| 5,592,131 A | * | 1/1997 | Labreche et al. | ........... 332/103 |
| 6,906,650 B2 | * | 6/2005 | Frazier | ........................ 341/133 |
| 6,937,667 B1 | * | 8/2005 | Fullerton et al. | ........... 375/295 |
| 6,989,781 B2 | * | 1/2006 | Steinbuch | ..................... 342/85 |
| 2005/0264105 A1 | * | 12/2005 | Kawata | ....................... 307/106 |
| 2006/0148472 A1 | * | 7/2006 | Bradley | ....................... 455/434 |

FOREIGN PATENT DOCUMENTS

JP 2004-221724 8/2004
WO WO-2004/049567 A1 6/2004

OTHER PUBLICATIONS

"Multiplier Devices: MSD 700 Series—Step Recovery Diodes", *MicroMetrics, Inc.*, pp. 36-37, no date.
"Application Notes: Step Recovery Diodes", *MicroMetrics, Inc.*, pp. 94-96, no date.
J. L. Moll et al., "P-N Junction Charge-Storage Diodes", *Proc. IRE*, No. 50, pp. 43-53, Jan. 1962.

(Continued)

*Primary Examiner*—Dinh T. Le
(74) *Attorney, Agent, or Firm*—Browdy and Neimark PLLC

(57) ABSTRACT

A circuitry for generating a narrow impulse including an input device coupled to a matching circuitry that is coupled to a step recovery diode (SRD). The input device is configured to receive a succession of digital input signals, each characterized by having high level and low level portions. The signals having less than 50% duty cycle. The input device is configured to drive forward the SRD through the matching circuitry during the high level portion of the digital signal, whereby the SRD stores sufficient power for generating the narrow impulse following the falling edge of the high level portion of the digital input signal.

18 Claims, 5 Drawing Sheets

OTHER PUBLICATIONS

J. Zhang et al., "A New Model of Step Recovery Diode for CAD", *IEEE MTT-S Digest*, pp. 1459-1462, 1995.

J. Zhang et al., "Computer-Aided Design of Step Recovery Diode Frequency Multipliers", *IEEE Transactions on Microwave Theory and Techniques*, vol. 44, No. 12, pp. 2612-2616, Dec. 1996.

"Application Note 918—Pulse and Waveform Generation with Step Recovery Diodes", *Hewlett Packarge*, 5954-2056(10/84).

"Application Note 983—Comb Generator Simplifies Multiplier Design", *Hewlett Packard*, no date.

W. D. Ryan et al., "The Carrier-Storage Frequency Divider: A steady-State Analysis", *IEEE Transactions on Circuit Theory*, pp. 396-403, Sep. 1964.

Stephen Hamilton et al., "Technical Section: Shunt-Mode Harmonic Generation Using Step Recovery Diodes", *The Microwave Journal*, pp. 69-78, Apr. 1967.

Stan Goldman, "Computer Aids Design of Impulse Multipliers", *Microwaves & RF*, pp. 101-108 and 128, Oct. 1983.

K. L. Kotzebue, "A Circuit Model of the Step-Recovery Diode", *Proc. of the IEEE*, vol. 53, pp. 2119-2120, Dec. 1965.

J. L. Moll et al., "Physical Modeling of the Step Recovery Diode for Pulse and Harmonic Generation Circuits", *Proc. of the IEEE*, vol. 57, No. 7, pp. 1250-1258, Jul. 1969.

R. M. Scarlett, "Harmonic Generation with a Capacitor Exhibiting an Abrupt Capacitance Change", *Proc. of the IEEE*, pp. 612-613, May 1964.

H. T. Friis, "Analysis of Harmonic Generator Circuits for Step Recovery Diodes", *Proc. of the IEEE*, pp. 1192-1194, Jul. 1967.

R. S. Hall et al., "Impulse-Shunt Mode Harmonic Generation", *Digest of ISSCC*, pp. 66-69, Feb. 1966 International Solid State Circuits Conference.

S. M. Krakauer, "Harmonic Generation, Rectification, and Lifetime Evaluation with the Step Recovery Diode", *Proc. of the IRE*, pp. 1665-1676, 1962.

D. L. Hedderly, "An Analysis of a Circuit for the Generation of High-Order Harmonics Using an Ideal Nonlinear Capacitor", *IRE Transactions on Electron Devices*, pp. 484-491, Nov. 1962.

R. P. Rafuse et al., "THPM 7.2: Harmonic Multiplication with Punch-Through Varactors", *Digest of ISSCC*, pp. 68-69, Feb. 1966 International Solid State Circuits Conference.

R. Thompson, "Step Recovery Diode Frequency Multiplier", *IEEE Electron Letters*, pp. 117-118, Mar. 1966.

J. M. Manley et al., "Some General Properties of Nonlinear Elements—Part I. General Energy Relations", *Proc. IRE*, vol. 49, pp. 904-913, Jul. 1956.

R. G. Smart, "A General Steady-State Analysis of Power-Frequency Relations in Time-Varying Reactances", *Proc. IRE*, vol. 49, pp. 1051-1058, Jun. 1961.

D. B. Leeson et al., "Frequency Multiplication with Nonlinear Capacitors-A Circuit Analysis", *Proc. IRE*, vol. 47, pp. 2076-2084, Dec. 1958.

D. J. Roulston, "Efficiency of Frequency Multipliers Using Charge-Storage Effect", *Proc. IRE*, vol. 44, pp. 1961-1962, Dec. 1961.

Mark Kahrs, "50 Years of RF and Microwave Sampling", *IEEE Transactions on Microwave Theory and Techniques*, vol. 51, No. 6, pp. 1787-1805, Jun. 2003.

Jeong S. Lee et al., "A Low-Cost Uniplanar Sampling Down-Converter with Internal Local Oscillator, Pulse Generator, and IF Amplifier", *IEEE Transactions on Microwave Theory and Techniques*, vol. 49, No. 2, pp. 390-392, Feb. 2001.

K. H. Teng et al., "Microwave Phase-Locked Loop Circuit Development and Efficiency Improvement", *High Frequency Postgraduate Student Colloquim*, Sep. 8-9, 2003, Piscataway, NJ, USA, *IEEE*, pp. 128-131, Sep. 8-9, 2003.

Z. N. Low et al., "Novel Low Cost Higher Order Derivative Gaussian Pulse Generator Circuit", *ICCS 2004*, The Ninth International Conference on Singapore, China, Sep. 6-8, 2004, Piscataway, NJ, USA, *IEEE*, pp. 30-34, Sep. 6, 2004.

\* cited by examiner

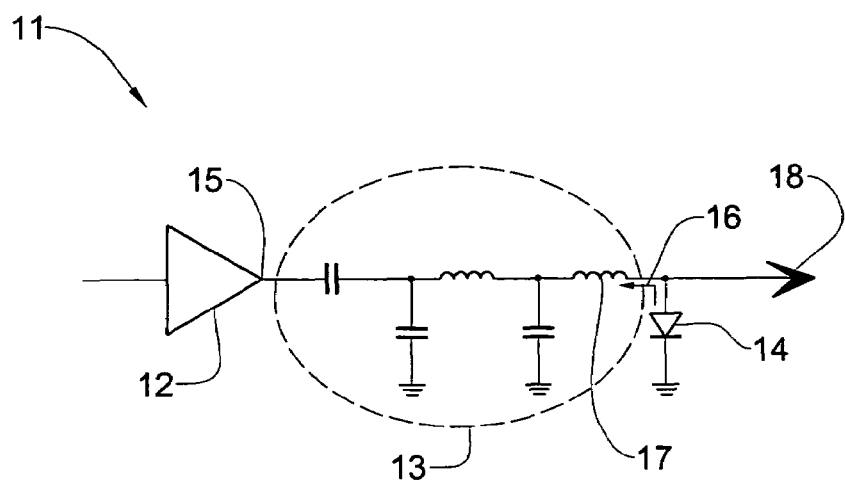
FIG. 1
(Prior Art)
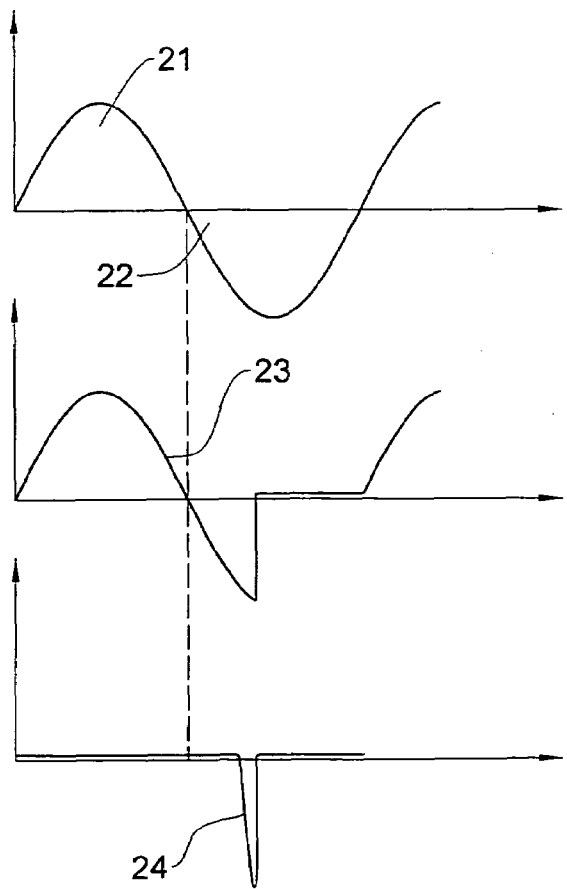
FIG. 2A
(Prior Art)
FIG. 2B
(Prior Art)
FIG. 2C
(Prior Art)

NARROW ULTRA WIDEBAND PULSE GENERATOR

FIELD OF THE INVENTION

The present invention is in the general field of generating narrow (ultra wideband) impulses for use in various ultra wide-band applications such as through the wall imaging applications, etc.

BACKGROUND OF THE INVENTION

Narrow (wideband) impulses for use as a driving signal(s) for various applications is generally know per se. Typical examples are, for instance, UWB communication, radar such as through the wall imaging, Comb generator, frequency multipliers, etc.

A generalized block diagram illustrating a typical impulse (comb) generator application is illustrated in FIG. 1 (as will be explained in greater detail below). Note that the circuitry of FIG. 1 (with additional filter coupled to the output of the circuitry) implements a frequency multiplier. Typical yet not an exclusive example of narrow impulses are those that fall in the range of 3-10 GHz. Note also that in many radar and imaging applications the repetition rate of the driving pulses is known to use low. In contrast, applications such as comb generators, multiplier and narrow impulse communication use typically high repetition rate.

It is known in the art to employ a so called Step Recovery Diodes for generating narrow (ultra wideband) impulses. As is generally known per se Step recovery diodes, or SRD's are used as impulse generator (they can be used as high order frequency multipliers and will multiply as high as 20× [when used as a comb generator]). Proper filtering and pulse shaping produces frequency multiplier (the familiar output of sharp, fast rise time pulses—this is generated by the SRD and inductor no need for filter or pulse shaper).

In operation, the SRD can store charge during the positive half of an input sinusoidal signal and then to extract that charge during the negative going half cycle. Consequently, a current pulse with a rise time equivalent to the "snap time" of the diode is generated in the impulse circuit of the pulse generator or comb generator (multiplier). The so generated signal can then be coupled to the desired application.

Bearing this in mind, attention is drawn to FIG. 1, illustrating, schematically, a circuitry for generating a narrow impulse, in accordance with the prior art. Attention is drawn also to FIGS. 2A-C showing simplified waveform signals used associated with the circuitry of FIG. 1.

As shown, the circuitry 11 includes a class A power amplifier 12 amplifying an input sine wave and driving known per se matching circuit 13 which is coupled to SRD 14. The positive half of the input sine wave (21 in FIG. 2A) gives rise to an amplified signal at the amplifier output 15, which, through the matching circuit 13, causes SRD 14 to be charged. When the input sine transients to the negative half (22 in FIG. 2A) the so stored charge is extracted and as a result, current flows through the SRD 14 and the matching circuitry 13 in the direction indicated by arrow 16. The current waveform is depicted schematically as 23 (FIG. 2B). As the current abruptly terminates, a short (ultra wideband) impulse (24, FIG. 2C) is generated over load 17 and fed through output 18 to the desired application such as a comb generator (multiplier).

Note that in order to drive sufficient current into and out of the SRD (e.g. 14 of FIG. 1), the power amplifier(s) has to be high power and requires high current to operate. This would be very inefficient, particularly when the rate of the input is low in the range of 1 MHz to 10 MHz. One of the immediate consequences would be that this high power consumption would adversely affect on the battery life span of any battery operated product accommodating a prior art narrow impulse generating circuitry.

There is thus a need in the art to provide a more efficient circuitry for generating narrow ultra wideband pulses.

SUMMARY OF THE INVENTION

The invention provides for a circuitry for generating a narrow impulse, comprising an input device coupled to a matching circuitry that is coupled to a step recovery diode (SRD); the input device is configured to receive a succession of digital input signals, each characterized by having high level and low level portions, the signals having less than 50% duty cycle; said input device is configured to drive forward the SRD through the matching circuitry during the high level portion of said digital signal, whereby said SRD stores sufficient power for generating said narrow impulse substantially following the falling edge of the high level portion of said digital input signal.

Still further, the invention provides for a circuitry for generating a narrow impulse, comprising an input device coupled to a matching circuitry that is coupled to a step recovery diode (SRD); said input device is responsive to said input signal and is capable of driving forward the SRD for a minimal duration for storing sufficient power, for generating narrow impulse.

BRIEF DESCRIPTION OF THE DRAWINGS

For a better understanding, the invention will now be described by way of example only, with reference to the accompanying drawings, in which:

FIG. 2A-C show simplified waveform signals associated with the circuitry of FIG. 1;

DETAILED DESCRIPTION OF SPECIFIC EMBODIMENTS

Figure 3:
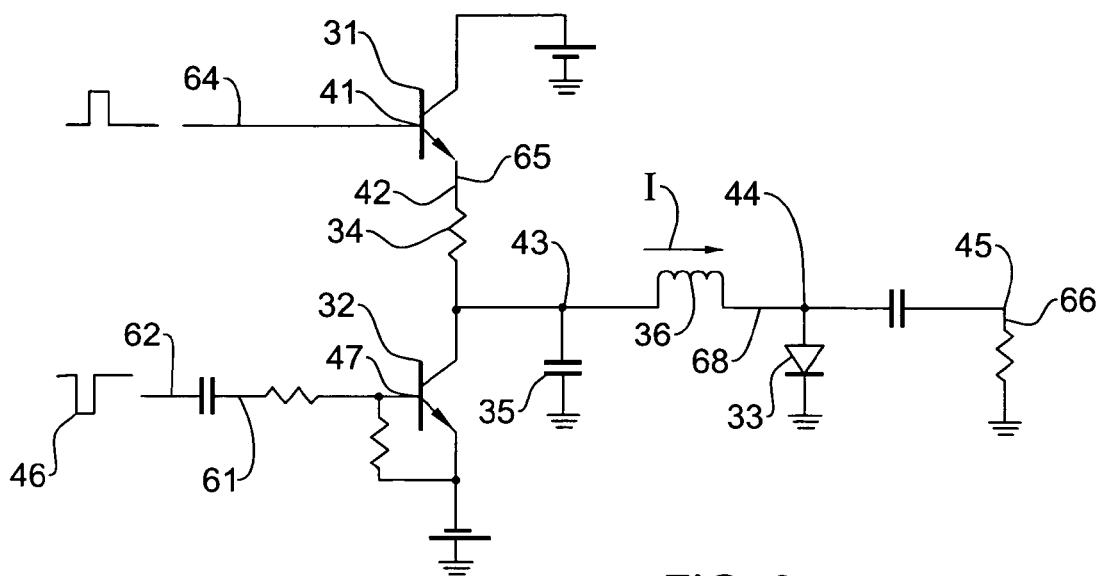
FIG. 3 illustrates schematically a circuitry for generating a narrow (ultra wide band) impulse, in accordance with an embodiment of the invention.
Figure 4:
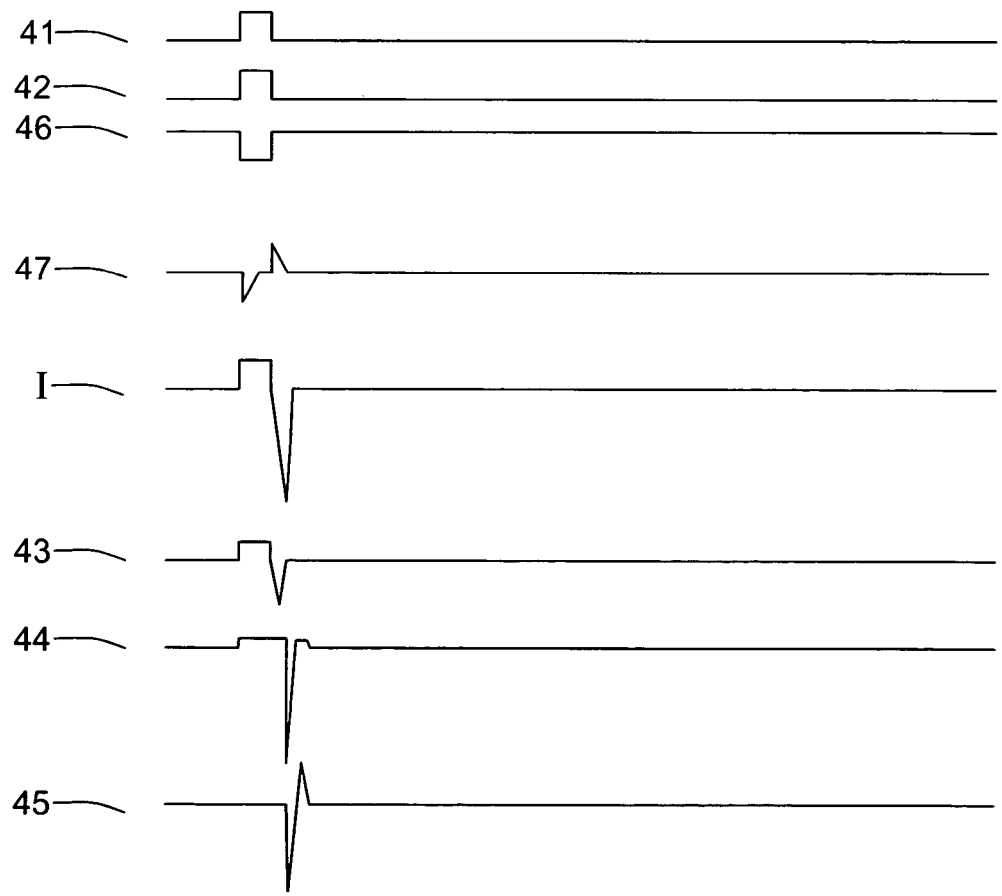
FIG. 4 shows simplified waveform signals used associated with the circuitry of FIG. 3.

Attention is now directed to FIG. 3 which illustrates schematically a circuitry for generating a narrow impulse, in accordance with an embodiment of the invention, and also to FIG. 4 showing simplified waveform signals used associated with the circuitry of FIG. 3.

Turning now to FIG. 3, the circuit is composed of an input device (by this particular example a switching transistor 31) and additional switching transistor 32. Switching transistor 31 drives current into a step recovery diode (SRD) 33 through an inductor preceded by capacitor to ground (constituting a part of an exemplary matching circuitry, as described in greater detail below). The input transistor 31 is driven by a digital input signal. As shown, the digital input signal that drives transistor 41 is a short positive pulse 41 (shown in FIG. 4), with a duty cycle of less than 50%. By this particular example, the duration of the pulse is few nanoseconds, say 15, and it may be independent of its repetition rate. In accordance with certain embodiments (applicable, for example, for through the wall imaging), the repetition rate falls in the range of 1-20 MHz, giving rise to 1.5-30% duty cycle, respectively. Therefore at low repetition rates, the current duty cycle can be very small and thus saving power. Note that the lower the duty cycle, the lower the power consumption of the circuitry. This is in clear contrast to prior art solutions where the driving input is a power consuming power amplifier.

Reverting now to FIGS. 3 and 4, in response to input signal 41, switching transistor 31 turns on for a short duration giving rise to a positive signal 42 which through resistor 34, capacitor 35 and inductor 36, generates forward current through the SRD 33. Note that the forward current is depicted as a positive pulse of current in chart I of FIG. 4. By this specific embodiment Resistor 34, capacitor 35 and inductor 36 constitute part of a matching circuitry coupling the input transistor 31 to the SRD diode 34. During the short duration of the forward current, the SRD stores charges.

An inverted digital input pulse 46 is AC coupled to the bottom transistor 32. Due to the AC coupling, the transistor turns on for a very short time (47) at the end of the pulse (46). Note incidentally that signal 46 substantially terminates at the end of input signal 41.

As a result, current through the inductor 36 and SRD 33 reverses and flows towards the negative supply (through SRD 33, inductor 36 and the turned on transistor 32). This negative peak immediately follows the positive current pulse (see chart I of FIG. 4). This negative peak current is very high as it is not limited by any resistance.

Once the charges are depleted from the SRD 33, the current flow stops abruptly (see the falling edge of the negative pulse in chart I) and consequently (in compliance with the L di/dt stipulation) a very short negative high impulse is generated over the inductor (see the negative waveform 44) with the capacitor (35) providing return to ground. This pulse constitutes the ultra wide band narrow pulse. The pulse is then AC coupled to the load (see waveform 45).

Note that the duration of the input digital signal (by the latter example 15 nano sec), can be configured experimentally such that sufficient charges will be stored in the SRD for allowing the generation of the narrow impulse of interest.

The invention is not generally bound by the specific circuitry depicted in FIG. 3. For instance, in accordance with certain embodiments, the matching circuitry may include additional components in addition or instead to the specified Resistor 34, capacitor 35 and inductor 36 and in accordance with other embodiments; the input device may be for example a bi-polar transistor, a FET transistor a logic gate, etc.

Figure 5:
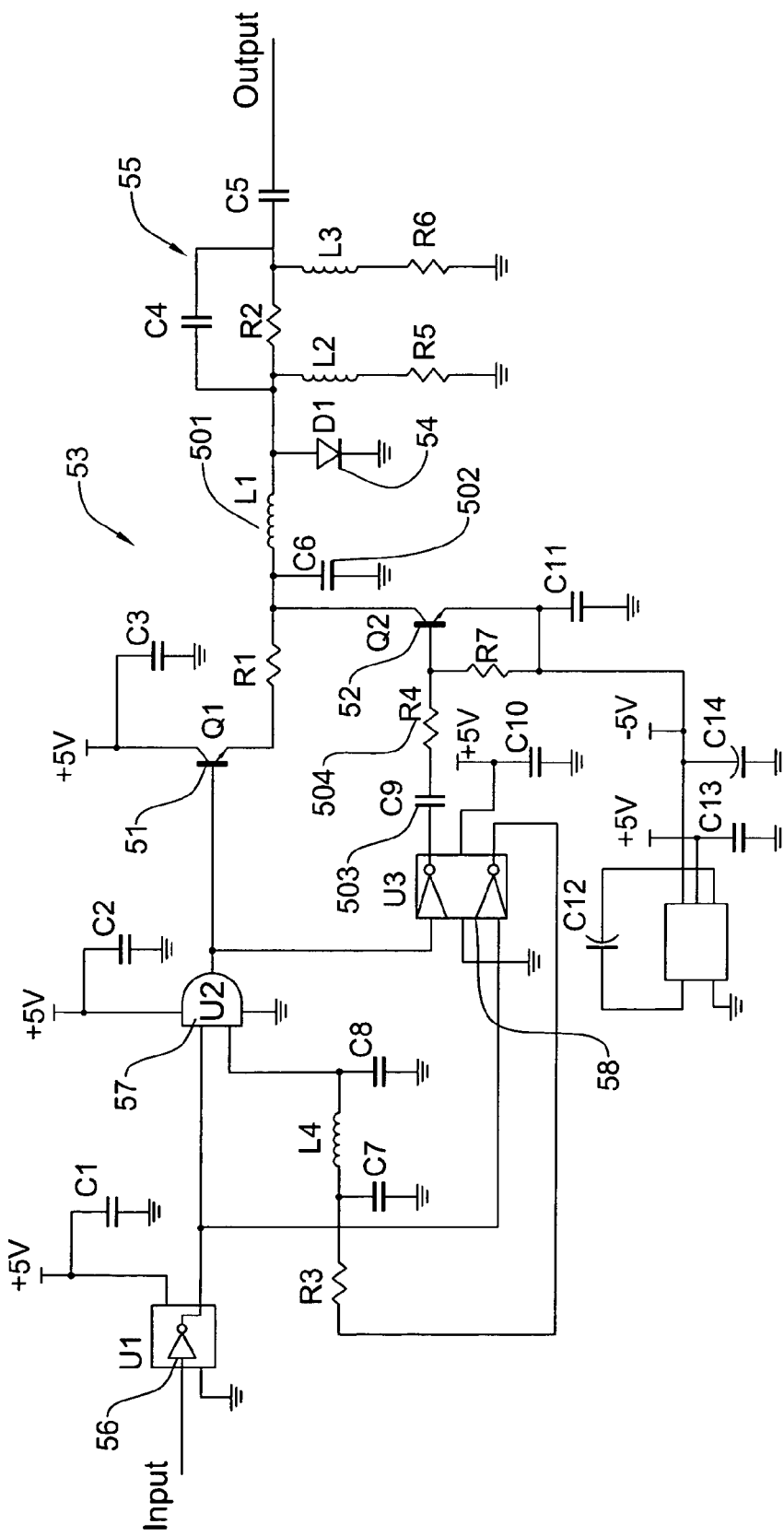
FIG. 5 illustrates schematically a circuitry for generating a narrow impulse, in accordance with an embodiment of the invention.

Attention is now drawn to FIG. 5 illustrating a circuitry in accordance with another embodiment of the invention.

The circuitry of FIG. 5 includes input device (e.g. switching transistor 51), transistor 52, additional matching circuitry components 53 coupling the input to the SRD 54, which in turn is coupled to the load, by this embodiment through equalizing filter 55. FIG. 5 illustrates, in a non-limiting manner, a pre-circuitry capable of generation of the digital input signal fed to input the input device (by this example transistor 51). Note that the power consumption of the pre-circuitry is very low and does not affect the overall low power consumption of the circuitry in accordance with the invention. Note also that the invention is by no means bound to the specific structure and operation of the pre-circuitry of FIG. 5.

Turning now to the structure and operation of the pre-circuitry in accordance with an embodiment of the invention, a Logic 0 to 5V signal at pulse repetition frequency of say 1 to 12 MHz drives an input buffer inverting gate U1 56. The gate feeds an AND gate U2 57 and an inverting gate of U3-B 58. The inverting gate U3-B 58 feeds a 13 nano second delay circuit comprising R2, L3, C9, and C10. The latter components implement a filter and perform delay to the pulse. U2 57 performs AND function of the signal out of U1 56 and a delayed version of the signal. The output of U2 57 is a positive logic 5V pulse with duration of about 15 nano second, constituting the digital input signal. The pulse out of U2 57 feeds the base of a high speed emitter transistor Q1 151. As specified above, the input signal width and the repetition rate thereof would affect the duty cycle of the input signal.

Having described the structure and operation of a pre-circuitry in accordance with an embodiment of the invention, the operation of the circuitry for generating the ultra wideband pulse will now be briefly described. Thus, similar to what has been described in a generalized fashion with reference to the embodiment of FIG. 3, the collector is connected to a 5V power supply and the emitter is connected to a 30 ohm resistor R1 59. A current flows through the transistor 51 and resistor 59 during the 15 nano second pulse. The current continues to flow through inductor L1 501 and the step recovery D1 54. Some of the current charges capacitor C6 502 and flows through the output filter C4, R2, R5, R6, L2, and L3, constituting collectively the equalizing filter 55 that is coupled to the load (not shown).

Revering for a moment to the pre-circuitry, the pulse out of U2 57 feeds an inverting gate U3-A 58. The inverted pulse at the gate output (58) goes through a capacitor C9 503 and base resistor R4 504 to feed the base of a high speed, high current transistor Q2 52. The rising edge of the base current pulse coincides with the end of the current flow through the SRD D1 54.

Bearing this in mind, attention is drawn again to the operation of the circuitry for generating the narrow impulse. Thus, as explained also with reference to FIG. 3 above, at this instance the SRD D1 54 and capacitor C6 502 are discharged through transistor Q2 52 and the negative power supply in high and short current pulse. The SRD D1 54 abruptly ceases the current flow when all the stored charges at the junction have been removed. The abrupt current termination through the inductor L1 (501) creates a large voltage pulse for a very short duration (in compliance with L dt/di). This pulse constitutes the output narrow impulse of interest. An output equalizing filter 55 (composed by this example of C4, R2, R5, R6, L2, and L3) attenuates the low frequency spectral content of the pulse and enhances the high frequency. Capacitor C5 (505) AC couples the pulse to the output.

As readily arises from the foregoing discussion, the circuit is driving current into the SRD for a duration that is long enough to store sufficient charges (in the SRD), which would eventually lead to the generation of the desired output narrow impulse. The short duration of the digital input pulse would render the circuitry efficient insofar as power consumption is concerned. As specified above, the power consumption is dependent also upon the repetition rate of the pulse which, together with the pulse width, constitute the input signal duty cycle.

Those versed in the art will readily appreciate that the invention is not bound by the specific structure and operation of FIG. 5.

Figures 1, 6A:
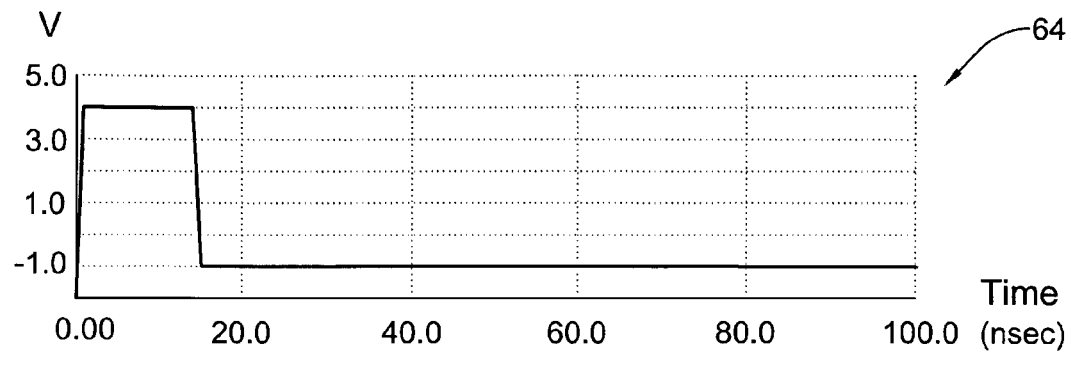
FIG. 1 illustrates schematically a circuitry for generating a narrow (ultra wide band) impulse, in accordance with the prior art.
FIGS. 6A-B illustrates a sequence of simulated waveforms associated with the circuitry of FIG. 3.
Figures 2, 6A:
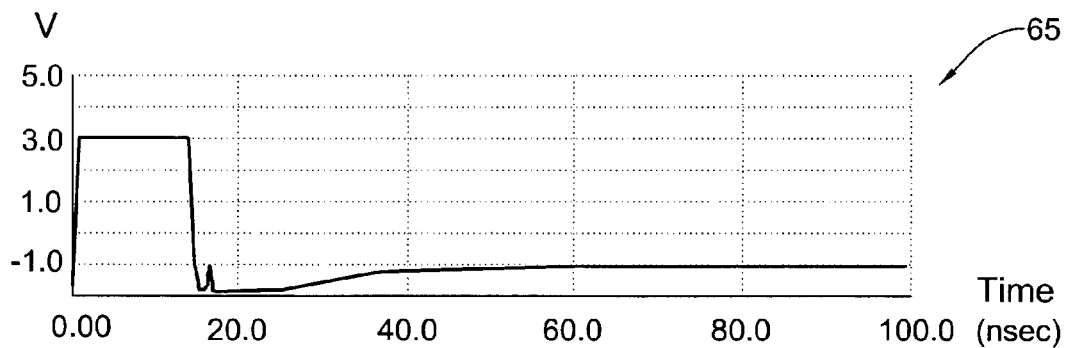
Figures 4, 6A:
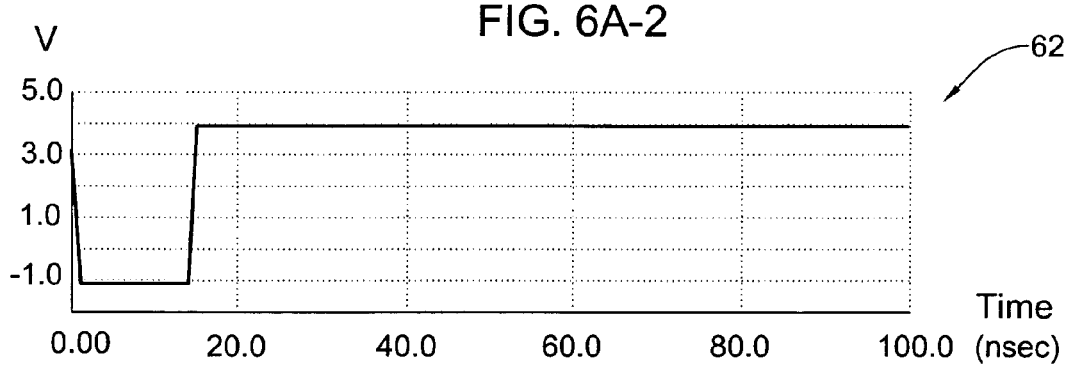
Figures 4, 6A:
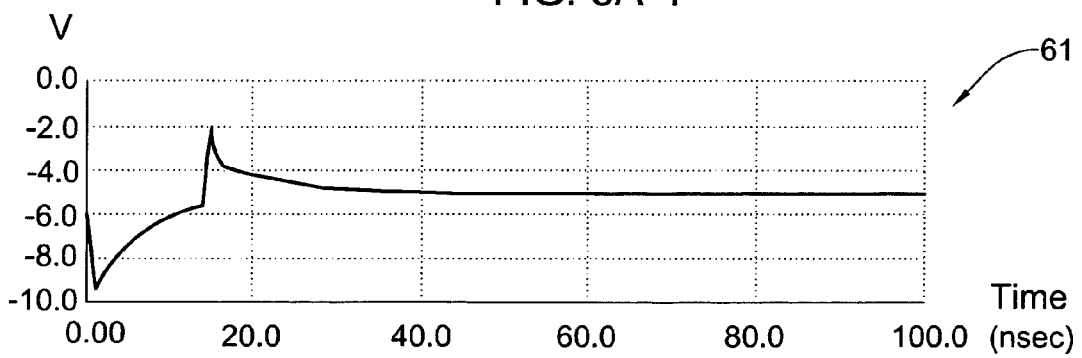
Figures 1, 6B:
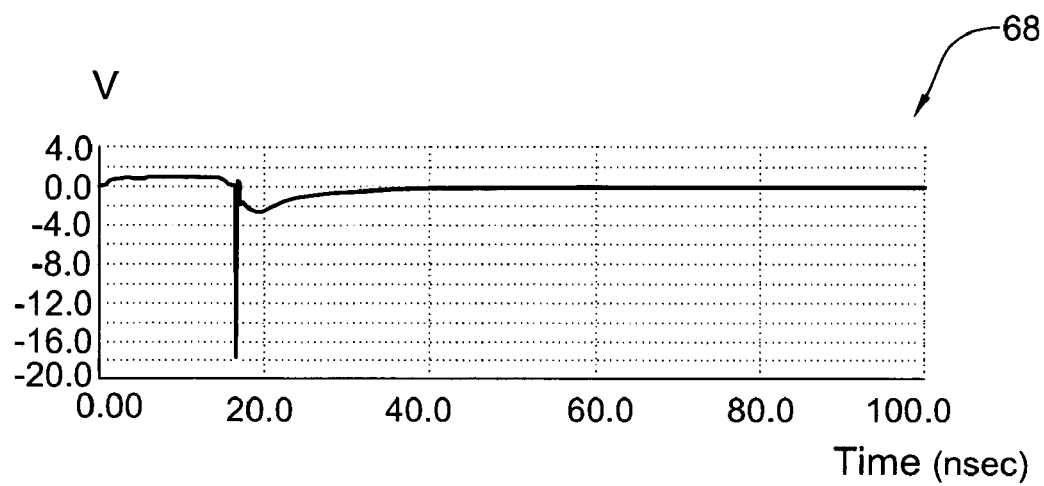
Figures 2, 6B:
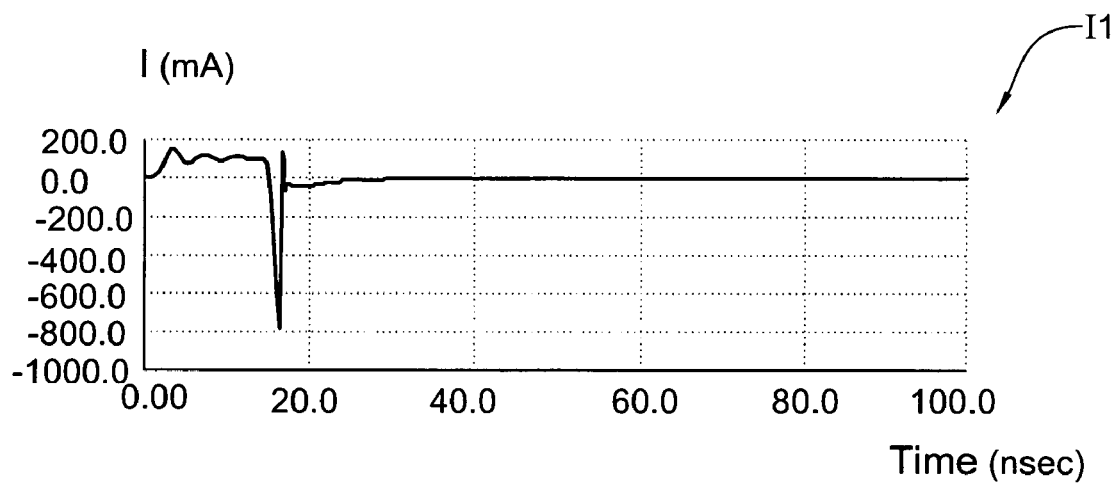
Figures 3, 6B:
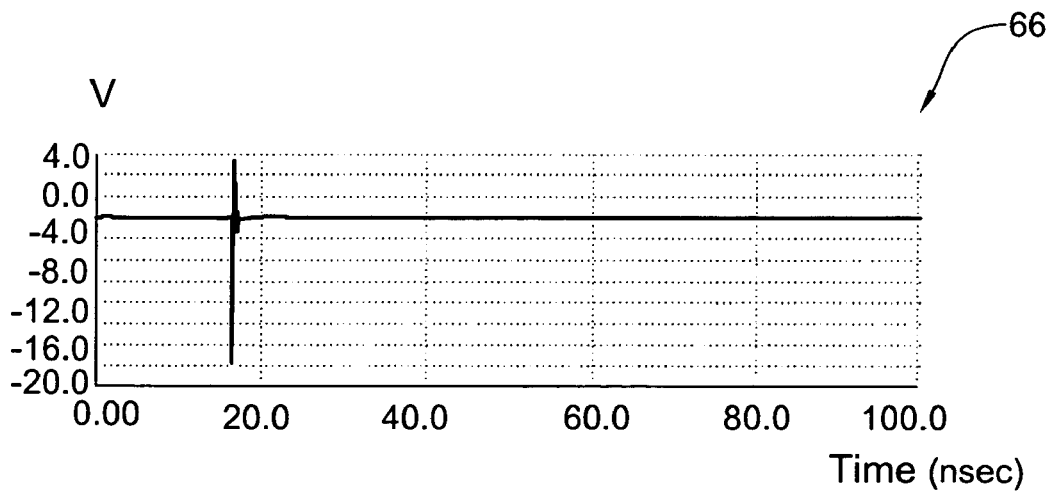

Attention is now drawn to FIGS. 6A-B illustrating simulated waveforms associated with the circuitry of FIG. 3.

The input transistor 31 is driven by a digital input signal. As shown, the digital input signal that drives transistor is a digital short positive pulse 64 (shown in FIG. 6A), with a duration of about 15 nano sec. This duration is sufficient to drive forward the SRD 33, for generating the output signal of interest. Note that the input signal can be generated for instance by the pre-circuitry described with reference to FIG. 5, above.

Reverting now to FIGS. 3 and 6, in response to input signal 64, switching transistor 31 turns on for a short duration giving rise to a positive signal 65 which, through matching circuitry, generates forward current through the SRD 33.

During the short duration of the forward current, the SRD stores charge. The positive current is illustrated in chart I1 (FIG. 6B), where as readily shown a forward current of about 100 m Amp (600) flows during the time period 0-15 nano sec.

An inverted digital input pulse 62 is AC coupled to the bottom transistor 32. Due to the AC coupling, the transistor turns on for a very short time (61) at the end of the pulse (64).

As a result, current through the SRD 33 reverses and flows towards the negative supply through the turned on Q2. This negative peak current (depicted as 601 in chat I1 of FIG. 6B) is very high (at the order of 800 mAmp) as it is substantially not limited by any resistance.

Once the charges are depleted from the SRD 33, the current flow stops abruptly (see the falling edge 602 of the negative pulse in chart I1 in FIG. 6B) and consequently (following the L di/dt stipulation) a very short negative high pulse is generated over the inductor (see the negative waveform 68). This pulse constitutes the ultra wide band narrow pulse. The pulse is then AC coupled to the load (see waveform 66).

Note that the invention can be used in numerous applications. Typical, yet not exclusive, examples are comb generator, multiplier, radar as through the wall imaging, UWB communication.

The invention has been described with a certain degree of particularity, but those versed in the art will readily appreciate that various alterations and modifications, maybe carried out without departing from the scope of the following Claims.

The invention claimed is:

1. A circuitry for generating a narrow impulse, for use in Ultra Wide Band (UWB) radar transmission, comprising: an input device coupled to a matching circuitry that is coupled to a step recovery diode (SRD); said input device comprising first and second switching transistors, at least said second transistor having a control electrode and each of said transistors being DC coupled to said SRD, and said input device being configured to receive a succession of digital input signals, each characterized by having high level and low level portions, the signals having less than 50% duty cycle; said input device further being configured to charge said SRD through said first transistor and to discharge said SRD through said second transistor for a short period of time by AC coupling said control electrode of said second transistor to an inverted digital input signal, said input device being configured to drive forward said SRD through the matching circuitry during the high level portion of said digital signal, whereby said SRD stores sufficient charge for generating said narrow impulse substantially following the falling edge of the high level portion of said digital input signal.

2. The circuitry according to claim 1, wherein said narrow impulse falls in the range of 3-10 Ghz.

3. The circuitry of claim 1, wherein said digital input signal having a repetition rate that falls in the range of 1-20 MHz.

4. The circuitry of claim 1, wherein said digital input signal has a time period of 15 nanoseconds or more.

5. The circuitry of claim 1, further comprising an output equalizing filter coupled to said SRD for outputting the generated impulse.

6. The circuitry of claim 1, wherein at least one of said transistors is a bi-polar transistor.

7. The circuitry of claim 1, wherein at least one of said transistors is a FET.

8. The circuitry of claim 1, wherein said input device includes a logical gate.

9. The circuitry of claim 1, wherein said circuitry is fitted in a comb generator.

10. The circuitry of claim 1, wherein said circuitry is fitted in a frequency multiplier.

11. The circuitry of claim 1, wherein said circuitry is fitted in a device for imaging through a wall.

12. The circuitry of claim 1, for use in a low power consumption application.

13. A circuitry for generating a narrow impulse, for use in Ultra Wide Band (UWB) radar transmission, comprising an input device coupled to a matching circuitry that is coupled to a step recovery diode (SRD); said input device comprising first and second switching transistors, at least said second transistor having a control electrode and each of said transistors being DC coupled to said SRD, and said input device isbeing responsive to said input signal for charging said SRD through said first transistor and discharging said SRD through said second transistor for a short period of time by AC coupling of said control electrode of said second transistor to an inverted digital input pulse; and wherein said input device is capable of driving forward SRD for a minimal duration for storing sufficient energy, for generating the narrow impulse.

14. The circuitry according to claim 13, wherein said narrow impulse falls in the range of 3-10 GHz.

15. The circuitry of claim 13, wherein said digital input signal having a repetition rate that falls in the range of 1-20 Mhz.

16. The circuitry of claim 13, wherein said digital input signal has a time period of 15 nanoseconds or more.

17. The circuitry of claim 13, further comprising an output equalizing filter coupled to said SRD for outputting generated impulse.

18. The circuitry of claim 13, wherein said circuitry is fitted in a device for imaging through a wall.

* * * * *